(12) United States Patent
Howard et al.

(10) Patent No.: US 6,307,752 B1
(45) Date of Patent: Oct. 23, 2001

(54) HOUSING FOR ELECTRICAL DEVICE WITH RELIEF FOR SHEARABLE RIBS

(75) Inventors: Carol A. Howard, Oxford; Ward E. Strang, Fairfield, both of CT (US)

(73) Assignee: Hubbell Incorporated, Orange, CT (US)

(*) Notice: Subject to any disclaimer, the term of this patent is extended or adjusted under 35 U.S.C. 154(b) by 0 days.

(21) Appl. No.: 09/475,472

(22) Filed: Dec. 30, 1999

(51) Int. Cl.[7] .................................................. H05K 5/00
(52) U.S. Cl. ............................................. 361/752; 361/807
(58) Field of Search .................................... 361/752, 753, 361/801, 802, 807, 810; 206/706; 211/41.17; 220/4.02

(56) References Cited

U.S. PATENT DOCUMENTS

| | | | |
|---|---|---|---|
| 4,585,122 | * | 4/1986 | Stegenga ............................ 206/334 |
| 4,652,969 | * | 3/1987 | Stegenga ............................ 361/384 |
| 4,918,572 | * | 4/1990 | Tarver et al. ...................... 361/395 |
| 4,958,259 | * | 9/1990 | Berg et al. ......................... 361/394 |
| 5,111,362 | | 5/1992 | Flamm et al. . |
| 5,217,389 | | 6/1993 | MacKay et al. . |
| 6,239,986 | * | 5/2001 | Otsuka ............................... 361/796 |

* cited by examiner

Primary Examiner—Jeffrey Gaffin
Assistant Examiner—Thanh Phan

(57) ABSTRACT

A housing for an electrical device including opposed supports or ribs receiving thereon a circuit board having first and second sides separated by a width "a". A first board support is attached to the housing and has a first side surface, a first support surface substantially perpendicular to the first side surface for supporting the circuit board, and a first recess in the first support surface. A second board support is attached to an opposing side surface of the housing. The side surfaces of the board supports are separated by a distance "b". When distance "a" is greater than distance "b", the circuit board is retained in an interference fit. Scrapings that are formed during the insertion of the circuit board into the housing can be collected in the support recesses, which provide relief areas, to avoid interfering with the proper seating of the circuit board on the board supports.

20 Claims, 3 Drawing Sheets

HOUSING FOR ELECTRICAL DEVICE WITH RELIEF FOR SHEARABLE RIBS

FIELD OF THE INVENTION

This invention relates to a shearable rib or support in a housing for an electrical device. More specifically, the invention supports and retains a circuit board, and prevents sheared plastic shavings, formed when the circuit board is inserted into the housing and scrapes along the ribs, from interfering with proper seating of the circuit board during assembly. This interference is avoided by use of a relief or recess in the rib that collects the shavings.

BACKGROUND OF THE INVENTION

A need exists for a means to prevent sheared plastic shavings or scrapings from interfering with the proper seating of a circuit board in the housing of an electrical device.

One common way to retain a circuit board in an electrical device is to attach the circuit board to the housing using screws or clips. A screw is typically passed through a hole in the circuit board and received in the housing. Circuit board size and shape is generally optimized in order for the circuit board to fit within the dimensions of the housing for the electrical device. Supports or ribs for the circuit board are variously located throughout the housing, and can be located along the side walls. Uses for the supports include cooling for the device, as well as for the prevention of undesirable contact between components mounted on the circuit board and other components, wires and the like located near the circuit board.

When the supports are located along the side walls of the housing, sides of the circuit board scrape along the sides of the supports during assembly. When the supports are made of plastic, shavings or scrapings may be generated during the installation of the circuit board. By the time the circuit board reaches the resting destination on the supports, sheared plastic shavings may have accumulated between the supports and the circuit board. These plastic shavings can interfere with the proper and full seating and retention of the circuit board within the housing, and cause misalignment of critically located components and parts to be snap fitted together.

Consequently, there is a need for a circuit board support rib that can accommodate the shavings, resulting in proper seating of the circuit board within the housing.

SUMMARY OF THE INVENTION

One object of the present invention is to provide a support for a circuit board in an electrical device capable of both retaining the circuit board and collecting scrapings caused by insertion of the circuit board in the electrical device.

Another object of the invention is to provide a means for frictionally retaining a circuit board and collecting scrapings that can interfere with the proper seating of the circuit board.

The foregoing objects are basically attained by providing a housing for an electrical device, the housing supporting a board having first and second sides separated by a width "a", having a housing body; a first board support attached to the housing body having a first side surface, a first support surface substantially perpendicular to the first side surface for supporting the board, and a first recess in the first support surface; a second board support attached to the housing body having a second side surface, a second support surface substantially perpendicular to the second side surface for supporting the board, and a second recess in the second support surface, a distance "b" separating the second side surface and the first side surface being less than the width "a" of the board; wherein the board is inserted into the housing body, the first side of the board scrapes along the first side surface, and the second side scrapes along the second side surface resulting in scrapings that can collect in the first and second recesses, and wherein the board is frictionally retained between the first and second board supports.

The foregoing objects are also attained by providing a housing for an electrical device, the housing supporting a board having first and second sides, the combination comprising means, coupled to the housing, for frictionally retaining the board in the housing; means for collecting scraped material, the scraped material resulting when the board is inserted into the housing and the first and second sides scrape along the means for frictionally retaining; wherein some of the scraped material is collected in the means for collecting so as not to interfere with the seating of the circuit board on the means for frictionally retaining.

Other objects, advantages and salient features of the invention will become apparent from the following detailed description, which, when taken in conjunction with the annexed drawings, discloses preferred embodiments of the present invention.

BRIEF DESCRIPTION OF THE DRAWINGS

Referring to the drawings which form a part of the original disclosure.

DETAILED DESCRIPTION OF THE PREFERRED EMBODIMENT

Figure 1:
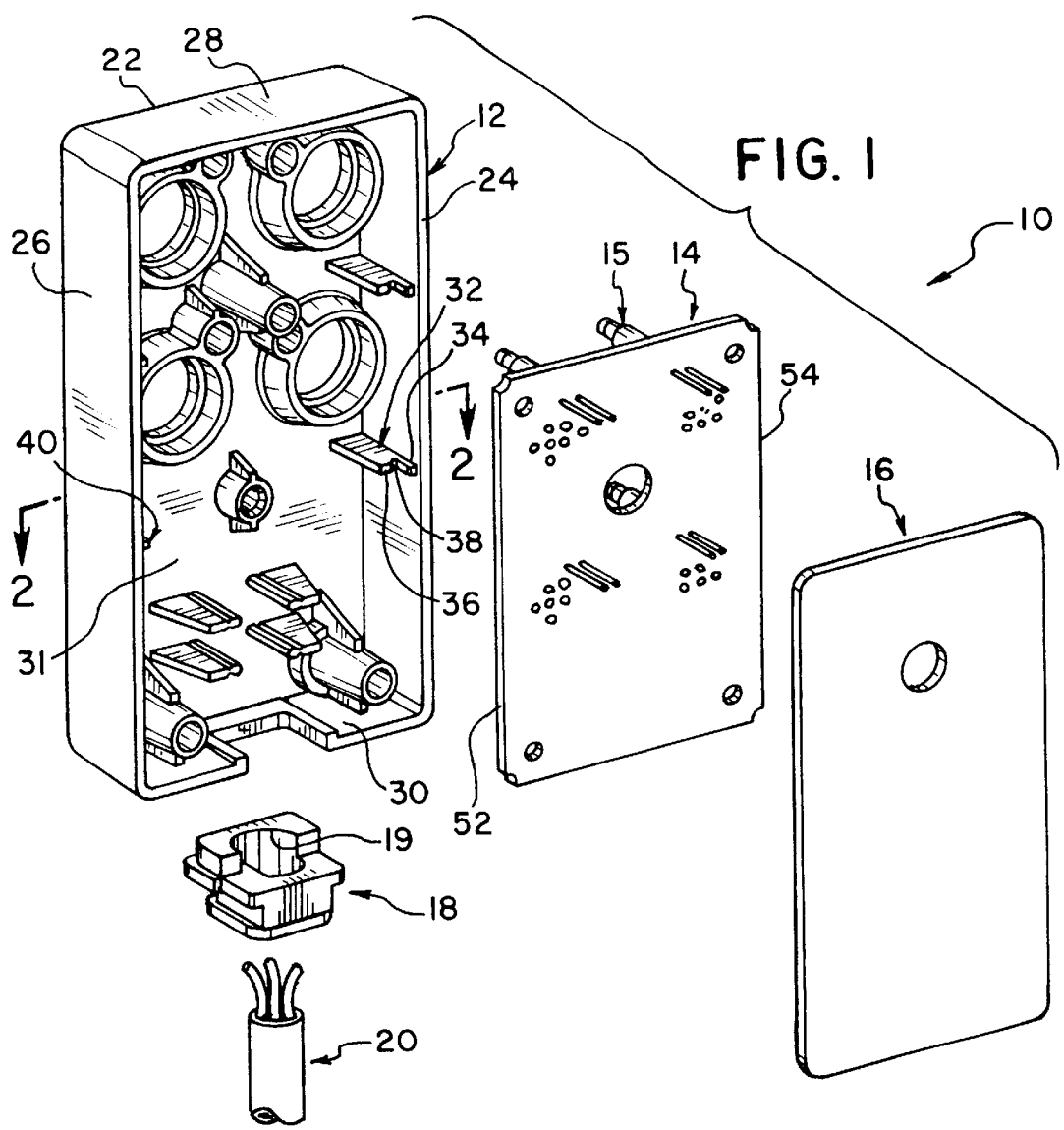
FIG. 1 is an exploded perspective view of the electrical device of the present invention, showing a housing, a circuit board for insertion into the housing, and a cover for covering the circuit board and housing.

As seen in FIGS. 1–7, an electrical wiring device 10 in accordance with the first embodiment of the present invention is illustrated, and includes a housing 12, a circuit board 14 received in the housing 12, a cover 16 for covering the circuit board 14, a grommet 18 also received in the housing 12, and conduit 20 which is received through the grommet 18 and into the housing 12.

Housing 12 is substantially rectangular, having two side walls 24, 26 parallel to the longitudinal axis, and two transverse walls 28, 30 which are substantially perpendicular to the two side walls 24, 26. The two side walls 24, 26 and the two transverse walls 28, 30 are perpendicular to and attached to a substantially planar front wall 31 forming the housing 12.

Housing 12 can be fabricated from any plastic generally used for electrical devices, and may be formed using injection molding, or any other technique known in the art.

Circuit board 14 is any circuit board known in the art, and can be a printed circuit board. Circuit board 14 is preferably substantially rectangular with substantially smooth and flat first and second side edges 52 and 54, which are substantially parallel to one another. Circuit board 14 can be fabricated from fiberglass, cardboard, wood, plastic, ceramic or other materials commonly used in the art of circuit boards and printed circuit boards. Electronics 15 can be transistors, resistors, switches, diodes, wires, or other suitable electronics adapted to be attached to the circuit board 14.

Cover 16 is used to cover one side of the circuit board 14 and a portion of the housing 12. The cover can be fabricated from paper, cardboard, plastic, fiberglass, or other materials commonly used as covers for electronic devices. The cover can be attached to the circuit board 14 and/or the housing 12 by means of screws, nails, adhesive, glue, hook and loop fasteners, or other means commonly used to attach, either removably or permanently, the cover to an electrical device. The cover can be used to protect the circuit board 14 and the electronics 15 from environmental contamination and undesirable electrical contact with devices outside of this invention.

Grommet 18 is received in side wall 30 for the guiding of and passing through of conduit 20. The grommet 18 can be flexible and fabricated from rubber or plastic, or any other material known in the art to be used as a grommet. Grommet 18 is retained in the traverse wall 30. Conduit 20 passes through grommet opening 19, which is sized to be close-fitting about the conduit 20 while preventing environmental contaminants such as dust and debris from entering housing 12. It is preferable that grommet 18 be flexible and pliable in order to allow conduit 20 of various sizes and types to pass through.

Conduit 20 carries information and/or power, for example, electrical or optical, to the electrical wiring device. Conduit 20 can be a shielded cable containing multiple wires or optical fibers or any other electrical or optical conduit known in the art. One end of conduit 20 can be attached to a source of information or power, while the other end is attached to the circuit board 14 and components 15. It is preferable that conduit 20 be able to pass through grommet opening 19.

A first board support or rib 32 is attached to the first side wall 24 of housing 12. The first board support 32 can be fabricated from the same material as the first side wall 24 or any other compatible material, and may be integral with the first side wall 24. The first board support 32 can also be fabricated independently of the first side wall 24 and attached using, for example, adhesive, hot melt, glue, solvent welding, fusion, or other methods known in the art for attaching the board support 32 to the first side wall 24.

The first board support 32 has a first substantially smooth and flat side surface 34 and a first support surface 36 substantially perpendicular to the first side surface 34. When the circuit board 14 is fully inserted into the housing 12, a portion of the circuit board 14 rests on the first support surface 36. A first recess 38 is situated in the first support surface 36, preferably adjacent the side surface 34, and prevents debris from interfering with proper seating of the circuit board 14 on the first support surface 36.

A second board support or rib 40 is situated on the second side wall 26 and is substantially opposite the first board of support 32. The second board support 40 has a second substantially smooth and flat side surface 42 similar to and substantially parallel to the first side surface 34, a second support surface 44 similar to the first support surface 36, and a second recess 46 similar to the first recess 38. The second board support 40 is preferably fabricated from the same material as the first board support 32.

The first board support 32 and the second board support 40, with the first and second side surfaces 34, 42 substantially opposing each other, are separated by a distance such that the circuit board 14 can be frictionally retained between the first and second supports 32, 40 by way of an interference, or pressure fit.

The interference fit and the frictional retention of the circuit board between the first and second supports 32, 40 results when the circuit board 14 is inserted into the housing 12. During insertion, the first and second side edges 52, 54 of circuit board 14 scrape along the first and second side surfaces 34, 42 of the first and second board supports 32, 40. The scraping of side surfaces 34, 42 results in pieces of the first and second board supports 32, 40, and possibly edges 52 and 54 of the circuit board 14, being scraped off, forming scrapings 56. These scrapings 56 fall either into the first and second recesses 38, 46 or off to the side of the first and second board supports 32, 40 and land elsewhere in housing 12. With scrapings 56 removed from side surfaces 34, 42, the resulting distance between the first and second board supports 32, 40 nearly equals the width of the circuit board 14, and exerts a retaining force to retain the circuit board 14 in position.

Figure 3:
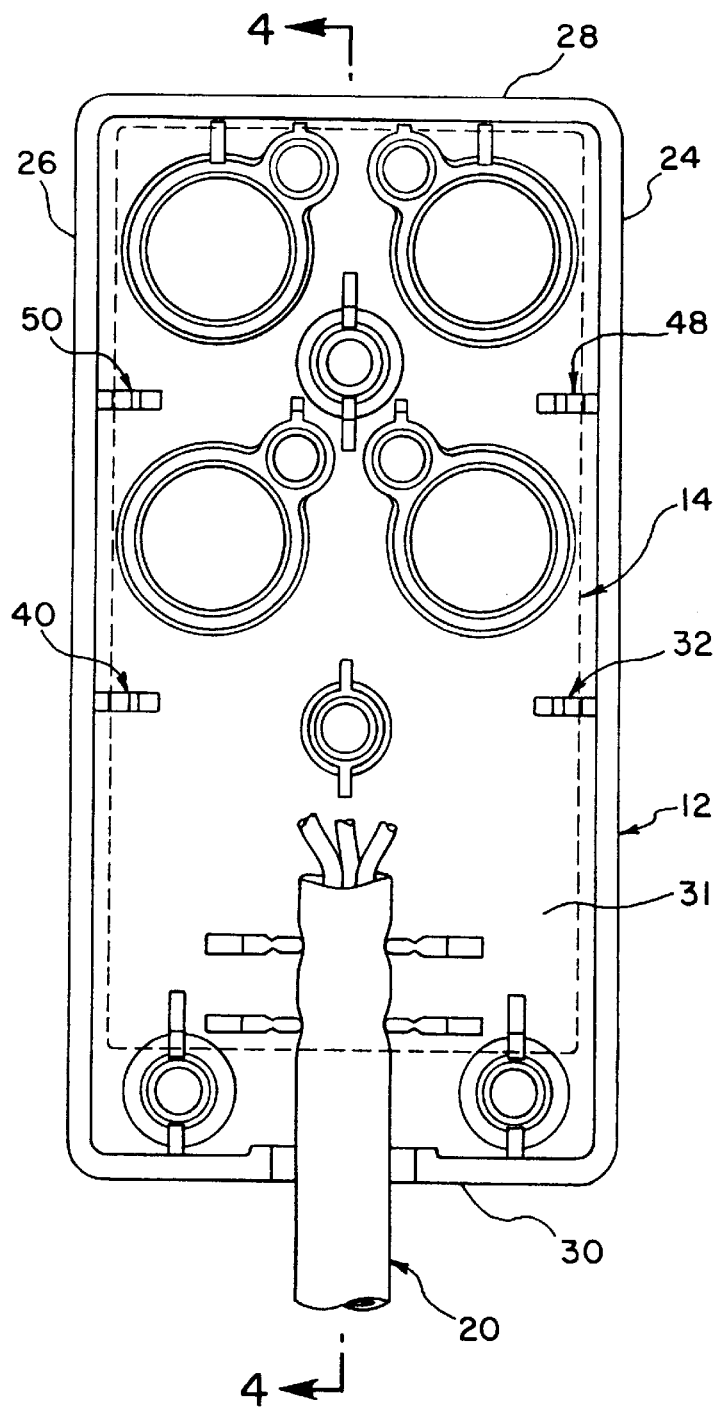
FIG. 3 is a rear perspective view of the housing with the inserted circuit board cut away.
Figure 4:
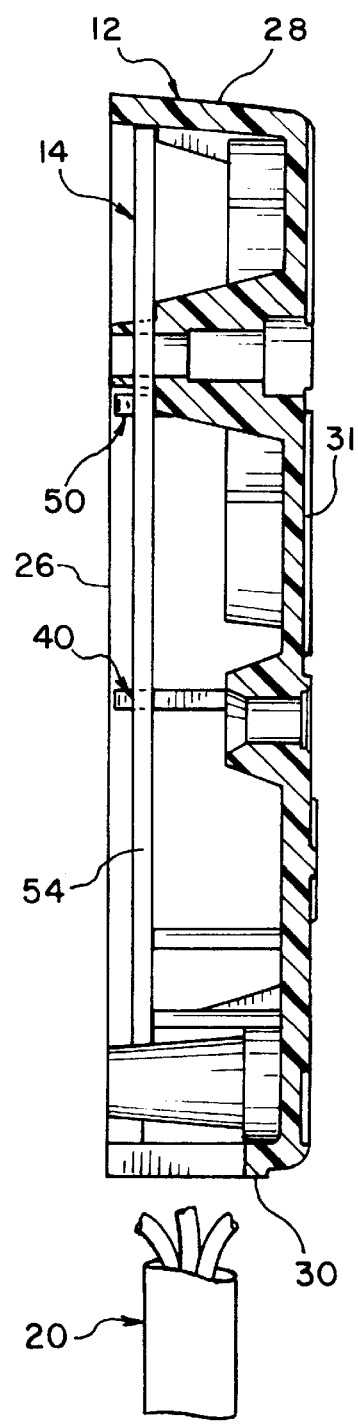
FIG. 4 is a cross-sectional side view of the housing and circuit board with the cable removed taken along 4—4 in FIG. 3.

FIG. 3 shows a rear view of the circuit board 14 inserted into housing 12. Circuit board 14 is cut away to view the seating of the circuit board 14 on board supports 32 and 40. A third board support 48 and a fourth board support 50, similar to the first and second board supports 32, 40 are also shown. The third and fourth board supports 48, 50 are also attached to the first and second side walls 24, 26 in opposing configuration. In this manner, the circuit board 14 is retained by two substantially opposing pair of board supports.

Figure 5:
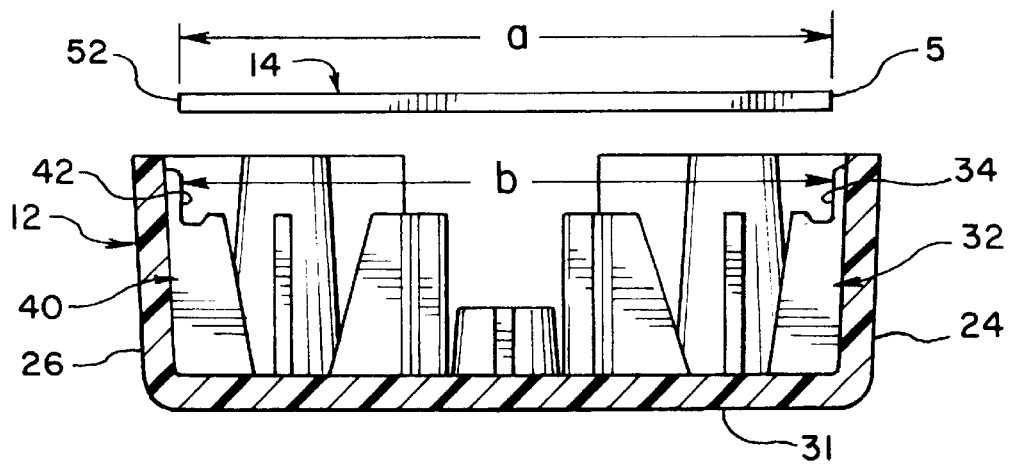
FIG. 5 is an end view similar to FIG. 2 prior to insertion of the circuit board into the housing body.
Figure 6:
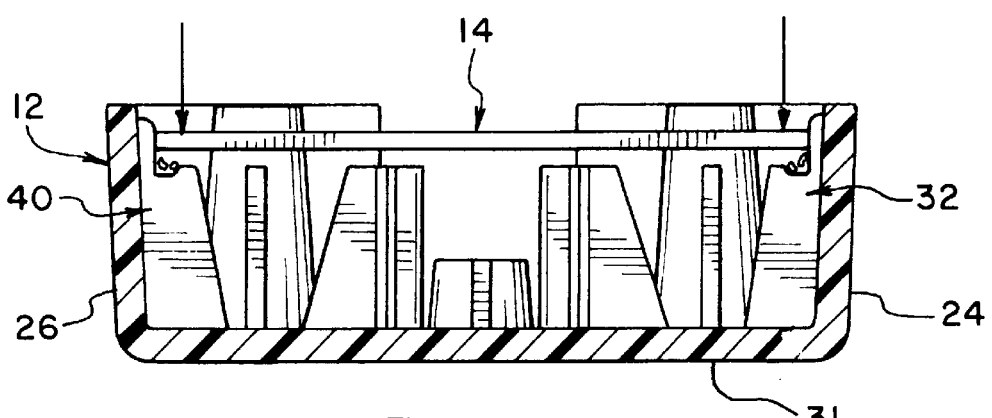
FIG. 6 is an end view similar to FIG. 2 with the circuit board partially inserted into the housing body.

FIG. 5 shows the circuit board 14 prior to insertion into housing 12. FIG. 6 shows circuit board 14 inserted into housing 12, but not yet seated on the first and second support surfaces 36, 44. FIGS. 5 and 6 have the same view as FIG. 2. In FIG. 5, width "a" represents the width from the first side edge 52 of circuit board 14 to the second side edge 54 of circuit board 14. Width "b" indicates the distance between the first side surface 34 of the first board support 32 and the second side surface 42 of the second board support 40. In the preferred embodiment, distance "b" separating the second side surface 42 and the first side surface 34 is less than width "a" of the circuit board 14.

By having the distance "b" less than width "a", circuit board 14 can be retained between the first board support 32 and the second board support 40 by means of an interference, or pressure fit.

The difference between width "a" and distance "b" should be sufficient to form an interference fit between the board 14 and the first and second side surfaces 34, 42. It is preferable that distance "b" be about 0.005 inches to about 0.100 inches less than the width "a". In the preferred embodiment, distance "b" is about 0.060 inches less than width "a". It should be recognized by one skilled in the art that width "a" must be greater than distance "b" in order to have an interference fit, and the amount by which width "a" must be greater than distance "b" can vary with the flex of both the housing 12 and the circuit board 14. The flex of housing 12 and circuit board 14 will vary with the materials used to fabricate them. However, while it is desirable that the circuit board 14 be frictionally retained in housing 12 by means of an interference fit, it is undesirable that the first and second side walls 24, 26 of housing 12 be spread apart, resulting in an increase in distance "b" rather than a scraping of the material from the first and second side surfaces 34, 42.

Figure 2:
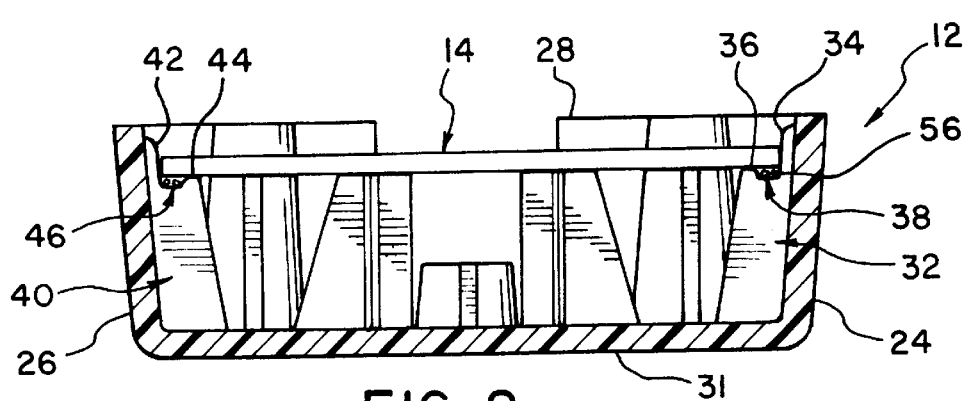
FIG. 2 is a cross-sectional end view of the housing with the circuit board inserted taken along 2—2 in FIG. 1.
Figure 7:
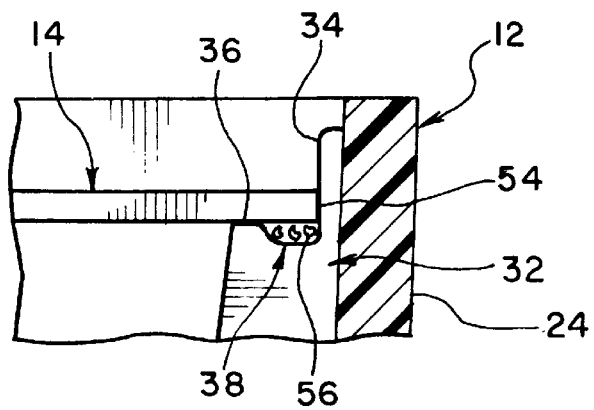
FIG. 7 is a close-up of one side of the circuit board properly seated on a support within the housing and sheared plastic scrapings collected in a recess in the support rib.

Recesses 38, 46 are generally U-shaped or channel shaped, and are designed to accommodate scrapings 56. That is, when scrapings 56 are contained in recesses 38, 46, the scrapings 56 do not interfere with the proper seating of the circuit board 14 on the first and second support surfaces 36, 44, as seen in FIGS. 2 and 7.

While it is desirable that scrapings 56 are captured in recesses 38, 46, it is not undesirable that some of the scrapings will land elsewhere in housing 12. Recesses 38, 46 are preferably designed to prevent scrapings 56 from interfering between circuit board 14 and support surfaces 36, 44.

While only one advantageous embodiment has been chosen to illustrate the invention, it will be understood by those skilled in the art that various changes and modifications can be made therein without departing from the scope of the invention as defined in the appended claims.

What is claimed is:

1. A housing for an electrical device, the housing supporting a board having first and second sides separated by a width "a", the combination comprising:

a housing body;

a first board support attached to said housing body having a first side surface, a first support surface substantially perpendicular to said first side surface for supporting the board, and a first recess in said first support surface;

a second board support attached to said housing body having a second side surface, a second support surface substantially perpendicular to said second side surface for supporting the board, and a second recess in said second support surface;

a distance "b" separating said second side surface and said first side surface being less than the width "a" of the board;

wherein when the board is inserted into said housing body, the first side of the board scrapes along said first side surface, and the second side scrapes along said second side surface resulting in scrapings that can collect in said first and second recesses; and wherein the board is frictionally retained between said first and second board supports.

2. The housing of claim 1, wherein the board is a circuit board.

3. The housing of claim 1, wherein the board is a printed circuit board.

4. The housing of claim 1, wherein the first and second side surfaces are substantially flat.

5. The housing of claim 1, wherein the first and second side surfaces are substantially parallel.

6. The housing of claim 1, wherein the distance "b" between said first and second side surfaces is about 0.005 inches to about 0.10 inches less than width "a" of the board.

7. The housing of claim 1, wherein said first and second board supports are integrally formed with said housing body.

8. The housing of claim 1, wherein said first and second recesses are substantially U-shaped.

9. The housing of claim 1, wherein said first and second recesses are adjacent, respectively, said first and second side surfaces.

10. The housing of claim 1, wherein the first and second board supports are fabricated from a polymeric material.

11. A housing for an electrical device, the housing supporting a board having first and second sides, the combination comprising:

a housing body;

means, coupled to said housing body, for frictionally retaining the board on said housing body; and means for collecting scraped material, said scraped material resulting when the board is inserted into said housing body and the first and second sides of the board scrape along said means for frictionally retaining; and wherein some of said scraped material is collected in said means for collecting so as not to interfere with the seating of the board on said means for frictionally retaining.

12. The housing of claim 11, wherein said means for frictionally retaining the board to the housing body comprises:

a first board support attached to said housing body having a first side surface, a support surface substantially perpendicular to said first side surface for supporting the board, and a first recess in said first support surface; and a second board support attached to said housing body having a second side surface, a second support surface substantially perpendicular to said second side surface for supporting the board, and a second recess in said second support surface.

13. The housing of claim 12, wherein the first and second sides of the board are separated by a width "a", and a distance "b", separating said first and second side surfaces, and is less than width "a" of the board.

14. The housing of claim 11, wherein the board is a circuit board.

15. The housing of claim 11, wherein the board is a printed circuit board.

16. A housing for an electrical device comprising:

a board having first and second sides;

a housing body;

means, coupled to said housing body, for frictionally retaining said board on said housing body;

means for collecting scraped material, said scraped material resulting when said board is inserted into said housing body and the first and second sides of said board scrape along said means for frictionally retaining; and wherein some of said scraped material is collected in said means for collecting so as not to interfere with the seating of said board on said means for frictionally retaining.

17. The housing of claim 16, wherein said means for frictionally retaining said board to said housing body is a first board support attached to said housing body having a first side surface, a support surface substantially perpendicular to said first side surface for supporting said board, and a first recess in said first support surface; and a second board support attached to said housing body having a second side surface, a second support surface substantially perpendicular to said second side surface for supporting said board, and a second recess in said second support surface.

18. The housing of claim 16, wherein said first and second sides of said board are separated by a width "a", and a distance "b", separating said first and second side surfaces, is less than width "a" of said board.

19. The housing of claim 16, wherein said board is a circuit board.

20. The housing of claim 16, wherein said board is a printed circuit board.

* * * * *